(12) United States Patent  
Panzer et al.

(10) Patent No.: US 6,423,968 B1
(45) Date of Patent: Jul. 23, 2002

(54) METHOD FOR STRUCTURED ENERGY TRANSMISSION USING ELECTRON BEAMS

(75) Inventors: Siegfried Panzer; Jürgen Dånhardt, both of Dresden (DE)

(73) Assignee: F.O.B. GmbH Gesellschaft zur Fertigung Farbiger Optoelektronischer Bauelemente, Gröbers (DE)

( * ) Notice: Subject to any disclaimer, the term of this patent is extended or adjusted under 35 U.S.C. 154(b) by 0 days.

(21) Appl. No.: 09/284,300
(22) PCT Filed: Oct. 8, 1997
(86) PCT No.: PCT/DE97/02303
 § 371 (c)(1),
 (2), (4) Date: Apr. 9, 1999
(87) PCT Pub. No.: WO98/16947
 PCT Pub. Date: Apr. 23, 1998

(30) Foreign Application Priority Data

Oct. 12, 1996 (DE) .......................... 196 42 116

(51) Int. Cl.⁷ .......................... H01J 37/30; H01J 37/04
(52) U.S. Cl. ................ 250/307; 250/398; 250/492.2
(58) Field of Search .................. 250/310, 311, 250/396 R, 398, 397, 492.2

(56) References Cited

U.S. PATENT DOCUMENTS

| | | | |
|---|---|---|---|
| 4,282,437 A | * 8/1981 | Boie et al. | 250/398 |
| 4,845,362 A | * 7/1989 | Sicignano et al. | 250/310 |
| 5,081,354 A | * 1/1992 | Ohhashi et al. | 250/311 |
| 5,557,105 A | * 9/1996 | Honjo et al. | 360/310 |

FOREIGN PATENT DOCUMENTS

| | | |
|---|---|---|
| EP | 0 508 151 | 10/1992 |
| FR | 2294489 | 7/1976 |

\* cited by examiner

*Primary Examiner*—Bruce Anderson
(74) *Attorney, Agent, or Firm*—Collard & Roe, P.C.

(57) ABSTRACT

Multiple methods are known to process materials or alter their properties using an electron beam. Until now, it was not possible to impinge upon minuscule surface sections (pixel) with a given arrangement on the surface in order to achieve certain effects. According to the invention, the object to be impinged upon is moved contact-free under a mask. A bidimensional deflectable electron beam oscillating at a high frequency perpendicular to the direction of movement of the object is moved on the mask, the speed being essentially faster than that of the movement of the object. Said method can be used for processing any material, preferably plane or band-shaped objects, in order to achieve processing effects by means of physical or chemical reaction.

11 Claims, 1 Drawing Sheet

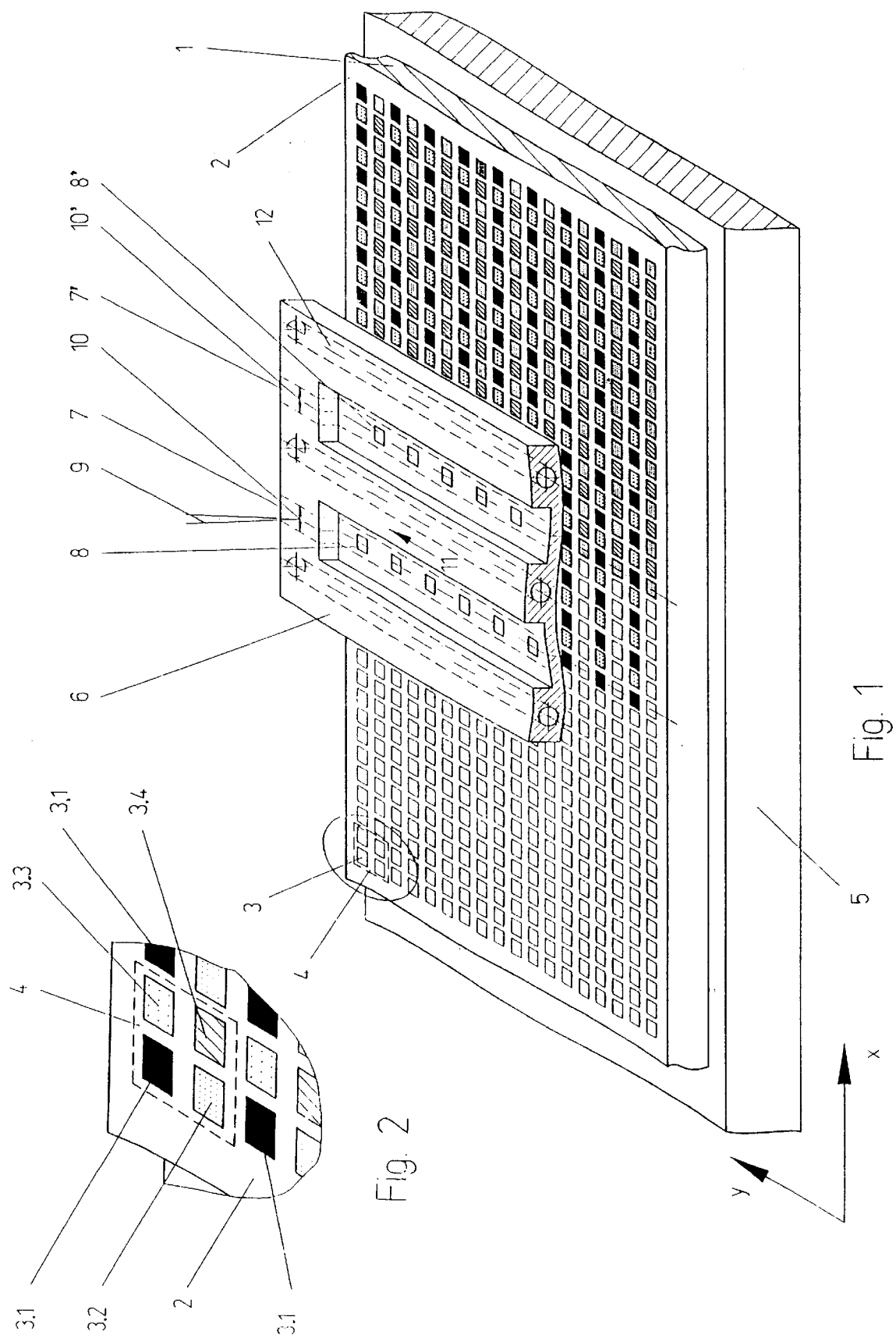

METHOD FOR STRUCTURED ENERGY TRANSMISSION USING ELECTRON BEAMS

The present invention relates to a method for structured energy transmission by transmitting for short periods energy using electron beams to limited surface elements of, preferably, plane surfaces of objects—such as parts, plates or bands of metallic, semi-conductive or dielectric materials or combinations of such. The useful processing effects are determined by the physical or chemical reactions of the materials to the energy transmission by means of electron beams. The preferred field of application is the structuring of surfaces on strip-shaped objects of any length by means of a limited number of repeated structural elements which are matrix-like arranged in columns and lines.

It is general knowledge how to use electron beams in a large variety of ways to respectively process materials or change material properties. In the main, probe- and mask-type processes are applied to generate surface structures.

Probe methods are characterised by the application of a focused electron beam which, according to the structural elements to be generated, affects the object by programmed beam deflection, which is known per se. With this method energy is transmitted to the different surface spots in a certain time sequence. The application of this method is extraordinarily flexible. However, its disadvantage is that it cannot generate structural elements whose lateral expansion is smaller than the diameter of the electron beam focal spot. Frequently, it is also not possible to place too high demands to the homogeneity of the energy density to be transmitted per surface unit within the structural elements. Although this method allows for a homogeneity improvement by reducing the focal point diameter via the modification of the opto-electronic focusing conditions, the adverse consequence is a reduction of the usable beam deflection amplitude. Then larger surfaces are processed by means of time-consuming mechanical shifting of the object, e.g. with the step-and-repeat technique. One limitation of the application of the probe method is particularly the structuring of large surfaces with densely located small structural elements, where the technically limited beam deflection velocity of the electron beam is able to extend the processing duration for a certain task till well into the range of the inefficiency of the processing method. In addition, when thermal processing effects are used, the probe method is often not able to meet the demand for a sufficient simultaneity of energy transmission to the entire structural element.

The structured energy transmission according to the mask method applies different task-specific variants—predominantly in electron beam lithography, where the optoelectronic imaging of a template, which illuminates the structural elements as recesses by the electron beam, has gained a certain significance. Combination techniques are also known, characterised by the optoelectronic imaging of a template which contains the structural elements and the latter's positioning on the object as defined by an additional beam deflection. The disadvantages of these techniques are their high apparatus requirements and the low values of the momentarily transmittable energy density. Hence, their practical application is restricted to electron beam lithography for the generation of latent structures in the micron and sub-micron range.

The invention is based on the task of developing a method for structured energy transmission to an object surface by means of electron beams which gets past the limitations of the prior art methods. Thus it shall be possible to impinge upon minuscule surface sections, e.g. pixels, using an electron beam with a given arrangement on the surface in order to achieve certain processing effects. In particular, it shall permit a defined variability of the transmitted energy density for a limited number of different structural elements. Non-thermal and thermal processing effects shall be achievable with a high productivity and a high quality.

According to the invention the task is solved according to the definitions of patent claim. Further advantageous embodiments are described in patent claims 2 to 11.

Essentially, the solution according to the invention is provided in that an electron beam is high-frequency deflected in the known way into one direction—the oscillation direction—according to a periodic function and, nearly perpendicular to the oscillation direction—in deflection direction -, is made to act using beam deflection via the recesses in a mask onto the surface of an object which is moved contact-free under the mask in the oscillation direction. The motion speed of the electron beam in the deflection direction is high compared to the speed of movement of the object. The energy is transmitted to the object surface sections, which are defined by the lateral expansion of the mask recesses, in several partial amounts that are determined by the frequency of the periodic deflection function, the speed of the beam deflection in the deflection direction, the beam diameter in the mask plane and the lateral expansion of the mask recesses. If there is a high demand to the homogeneity of the energy density the three first-mentioned influencing variables shall be matched. Most application require a constant energy density in at least one structural element, in which case it is suitable to use a known trigonometric function for the periodic beam deflection.

When carrying out thermal processing methods it is necessary to transmit the required energy density within a short period of time in order to achieve a quasi-adiabatic energy transmission, i.e. without any essential heat dissipation from the energy-absorbing material volume during the energy transmission period. Particularly in this case the electron beam is focused into the mask plane and the periodic deflection kept as high as technically possible, e.g. in the range between 100 kHz and 1000 kHz. The beam deflection speed into the deflection direction is rated sufficiently high so that the energy transmission period, which results from the ratio between the beam diameter in the mask plane and the beam deflection speed, meets the demands to a sufficient adiabatic beam deflection speed. The impact on the processing effect of the exact transmission of the periodic deflection function, which is hardly implementable in this case, is limited in the mirror points by choosing the amplitude larger by a number of beam diameters than the width of the recess sections in the mask.

If the structuring of an object requires energy densities that slightly vary locally, their adapted selection is suitably made by choosing an appropriate amplitude of the periodic deflection function.

If the structural elements are arranged matrix-like on the object, it is suitable to choose the two deflection directions nearly perpendicularly to each other according to the structural arrangement on the object.

If all structural elements shall be impinged with about the same energy density it is suitable to keep the beam deflection speed constant in the mask deflection direction. While in case of a high variation of the energy density it may advantageous to perform the matching by means of a position-depending deflection speed into the deflection direction.

During thermal processing methods the thermal loadability of the mask may limit the method. In such case it is advantageous to manufacture the mask of material with good heat-conducting and temperature-resistant properties and to design a water cooling system directly adjacent to the recess section. Here, the mask recesses are restricted to a gap. The parallel arrangement of a number of such gaps in the mask, through which the electron beam travels cyclically one after the other, can considerably increase the thermal loadability of the mask. Such arrangement of gaps in the mask can also be advantageous when structural elements, which are located on the object closely to each other in the direction of the gap, shall be impinged with differing energy densities.

In order to achieve a high process productivity it is advantageous to move the object to be processed under the mask perpendicularly to the deflection direction and at a constant speed. High demands to the rectangularity of the processing structure on the object can be met under these conditions by turning the mask towards the structure on the object—at constant beam deflection speed into the deflection direction—in such a way that the impact of the operating time effect on the position of the surface elements on the object which are impinged by the electron beam is eliminated by the finite beam deflection speed into the deflection direction.

The process according to the invention can be particularly advantageously applied when strip- or band-shaped objects, whose width is within the implementable beam deflection amplitude in the deflection direction, shall be processed in a structured way. In case that the object width exceeds these limits it is possible to impinge the entire object surface by combining strip-shaped partial surfaces.

One advantageous application area is the highly efficient structured processing of objects with a relatively large surface. In the sphere of non-thermal electron beam processing this applies predominantly to the structured modification of plastic materials, the creation of colour patterns in materials filled with suited electron-beam-sensitive dyes.

In the sphere of thermal electron beam processing the process can be applied both in the optical structuring of suitably sensitised glass surfaces in order to generate displays and in the structured hardening of metal surfaces from hardenable materials or for abrasive processing, e.g. of plastics by means of material evaporation.

The preferred area of application of the process are plane strip- or band-shaped objects, although also curved surface can be processed, e.g. cylindrical objects, where, if need be, the mask shall be matched to the object shape.

In the following an embodiment of the invention is described in more detail with reference to the appended drawing, where FIG. 1: is an illustration of an object to be processed with the required means, FIG. 2: is an illustration of a surface element in an enlarged representation (Trimmed area A).

A 10-cm wide strip-shaped glass substrate 1 with a specially prepared thin surface layer 2 shall be structured by electron beam processing in a surface structure consisting of pixels 3 that are arranged in a square, orthogonal matrix, with four pixels 3 (3.1 to 3.4) each forming one colour element 4. In order to achieve the desired optical effect the four pixels 3 shall be impinged upon with slightly differing energy densities. This processing effect is a thermal effect which requires the pixel 3 sections of the thin prepared surface layer 2 to travel through temperature cycles with the same duration but slightly differing temperatures so as to obtain certain optical properties in each individual pixel.

The process according to the invention is implemented as described in the following: The substrate 1 is placed on a common table 5 which moves in the x-axis. The table 5 is moved in the x-axis at a constant speed. The table drive, which is not shown, is connected to a known measuring system which defines the exact momentary movement co-ordinate in the x direction. The stationary mask 6 (only partially shown) is located directly above the substrate 1, but without contact to the latter. The mask contains the recesses 8; 8' along the gaps 7 and 7' through which the electron beam 9 is made to impact the pixels 3 on the substrate 1. The pixels 3 per each colour element 4 are impinged upon with slightly differing energy densities. The electron beam 9, with its appropriately stabilised parameters: accelerating voltage, beam current and beam diameter in the mask plane 6, initially impinges upon an intensively mask 6 area outside of the recesses 8. The electron beam 9 is deflected into the direction indicated by the arrow 10 (oscillation direction) parallel to the x direction and oscillating symmetrically to the axis of gaps 7; 7' according to a periodic delta function with 200 kHz.

The deflection amplitude is selected approx. five beam diameters larger than the expansion of the pixels 3. Thus the impact of the finite threshold frequency on the homogeneity of the energy density transmitted to the substrate 2 is sufficiently eliminated. Accelerating voltage, beam current, amplitude of periodic deflection and the preselected deflection speed are matched in such a manner that the required energy density can be transmitted in the pixels 3. Upon pixel 3.1 achieving congruence with the top recess 8 in gap 7 of the mask 6 the electron beam 9 is led with the appropriate speed across the entire substrate width in y direction. The electron beam 9 retracted across the cooled section of the mask 6 along the direction indicated by the arrow 11 into the second initial position indicated by the arrow 10' where, first, the amplitude of the periodic deflection function is matched to the required value of the necessary energy density. Upon the next pixels 3.2 achieving congruence with the next recess 8' in gap 7' of the mask 6 the electron beam 9 is led with the same deflection speed as before across the gap 7' of the recess 8' of the mask 6. The retracting of the beam on the mask 6 is made along the same route as indicated by the arrow 11 back into the position of the arrow 10. Now, following the previous amplitude matching of the periodic deflection function, the energy transmission is carried out analogously and, thus, the processing of the next pixels 3.3 and 3.4. The x distance of the axes of the gaps 7; 7', the operating period of the electron beam 9 across the substrate width and the adjusting times for the different periodic deflection amplitudes of the electron beam 9 are suitably matched in order to appropriately position the pixels 3 on the substrate 1. During the processing sequence colour elements 4 are generated which are matrix-like distributed across the entire surface of the object 1. Said colour elements 4 each consist of four pixels. As a result of the above-described processing steps the pixels 3.1–3.2–3.3–3.4 below the recesses 8 or 8' of the mask 6 are impinged upon by the electron beam 9 one after another and in quick succession. The energy intake of the electron beam 9 which changes during each pass of the electron beam 9, i.e. the energy intake is matched to the desired result, different optical properties are obtained for each pixel 3 in a given colour element 4. The energy density required for the above-described method is several Wsec/cm$^2$. An electron beam 9 with a radiant power of a few kW yields a typical deflection speed of >20 m/sec. At a substrate width of 10 cm the operating time of the electron beam 9 across the substrate is approx. 5 msec. A further max. 5 msec are necessary for retracting the beam and matching the amplitude. Hence, the processing time for one gap of structural elements is 10 msec, which means that 100 gaps can be processed per second. At a x distance of the gaps 7; 7' of the pixels 3 of 0.2 mm the required table motion speed is 2 cm/sec. Then the structured surface per second is 20 cm$^2$. The ratio between the table speed and the deflection speed of the electron beam 9 of 1. 1000 results in a corresponding deviation from the orthogonality between the rows and columns of pixel 3. If said deviation is unwanted it can be eliminated by a corresponding turning of the mask 6 in counter-clockwise direction.

The relatively high thermal load of the mask 6 requires its intensive cooling, which is provided by water cooling ducts 12 in the mask 6.

What is claimed is:

1. A method for the structured energy transmission using electron beams onto a glass substrate having a specially prepared surface layer by means of a focusable, bidimensionally deflectable electron beam comprising the steps of:

(a) moving the substrate under a mask having recesses without contact with said mask; and (b) moving the electron beam in the direction of movement of the substrate, said electron beam oscillating at a high frequency approximately perpendicular to the direction of movement of the substrate across the recesses present in the mask, so that the substrate is acted upon through each recess by the electron beam; and (c) coordinating a plurality of electron beam parameters with each other so as to form on the surface layer color elements comprising a plurality of pixels of varying color, the color of each pixel varying with the change in energy transmitted to the pixel, said parameters comprising acceleration voltage, beam current, periodic deflection amplitude and deflection speed.

2. The method of claim 1 further comprising the step of deflecting the electron beam in the direction of oscillation of the electron beam in accordance with a trigonometric function wherein an adiabatic introduction of energy takes place when a high surface energy density is transmitted so that each pixel to which said energy is introduced is not influenced thermally by neighboring pixels.

3. The method of claim 1 further comprising the step of deflecting the electron beam in the direction of oscillation of the electron beam in accordance with a periodic deflection function in which the beam deflection speed into the direction of movement of the substrate is sufficiently high so that the amounts of energy transmitted to the surface layer have a selected level of homogeneity.

4. The method of claim 3 wherein the amplitude of the periodic deflection function is selected to be higher than the expansion of the recesses in the mask located in the oscillation direction.

5. The method of claim 3 wherein the energy density to be transmitted at constant beam current is matched by changing the amplitude of the periodic deflection function.

6. The method of claim 1 wherein the speed for the deflection of the electron beam to its oscillation in vertical direction can be kept constant across the entire section of recesses in the mask.

7. The method of claim 1 wherein the speed of the electron beam deflection in orthogonal direction of the direction of the movement of the object is selected so high that the energy transmission to the pixels to be impinged upon is carried out without essential heat dissipation from the energy-absorbing material volume during the energy transmission period.

8. The method of claim 1 wherein the electron beam is position-dependent deflected at a variable speed to achieve a local variation of the energy density to be transmitted to the substrate.

9. The method of claim 1 wherein the mask is cooled.

10. The method of claim 1 wherein the substrate to be processed is moved under the mask at a constant speed.

11. The method of claim 1 wherein, according to the beam deflection speed perpendicular to the oscillation direction and the speed of the movement of the substrate, the mask is turned towards the y direction in such a manner that the operating time effect of the electron beam across the mask is eliminated regarding the co-ordinate position of the pixels which are impinged upon.

\* \* \* \* \*